(12) United States Patent
Shin

(10) Patent No.: US 6,204,131 B1
(45) Date of Patent: Mar. 20, 2001

(54) TRENCH STRUCTURE FOR ISOLATING SEMICONDUCTOR ELEMENTS AND METHOD FOR FORMING THE SAME

(75) Inventor: Hyun-Dong Shin, Seoul (KR)

(73) Assignees: Anam Semiconductor, Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/223,471

(22) Filed: Dec. 30, 1998

(30) Foreign Application Priority Data

Dec. 30, 1997 (KR) .................................................. 97-78396

(51) Int. Cl.[7] ........................... H01L 21/336; H01L 21/76
(52) U.S. Cl. ........................... 438/294; 438/296; 438/424
(58) Field of Search ................................... 438/294, 296, 438/424

(56) References Cited

U.S. PATENT DOCUMENTS 5,691,232 * 11/1997 Bashir et al. .
5,895,253 * 4/1999 Akram .

* cited by examiner

*Primary Examiner*—Richard Booth
*Assistant Examiner*—Josetta I. Jones

(57) ABSTRACT

A trench structure for isolating semiconductor elements includes a trench formed in a semiconductor substrate; and an insulating layer formed on the semiconductor substrate which fills up the trench, wherein the trench is provided at its bottom surface with at least two grooves which are filled by the insulating layer, whereby a surface area of the trench structure is increased.

6 Claims, 2 Drawing Sheets

TRENCH STRUCTURE FOR ISOLATING SEMICONDUCTOR ELEMENTS AND METHOD FOR FORMING THE SAME

BACKGROUND OF THE INVENTION

1. Field of the Invention

The present invention relates to the manufacture of semiconductor devices, and more particularly, to a trench structure for isolating semiconductor elements and a method for forming the same.

2. Description of the Related Art

There are two basic methods for isolating semiconductor elements on a semiconductor substrate: the LOCOS (localized oxidation of silicon) method, and trench isolation. However, with the increasing complexity and shrinking dimensions of semiconductor devices, trench isolation is emerging as the standard method of isolating semiconductor elements on semiconductor substrates.

FIG. 2 shows a conventional CMOS transistor having a dual-well. The conventional CMOS structure includes a semiconductor substrate 1 in which P and N-wells 7 and 8 are formed, isolation trenches T1 isolating the P and N-wells 7 and 8 from each other, an N-channel transistor 9 formed on the P-well 7, and a P-channel transistor 10 formed on the N-well 8.

In the above described CMOS structure, adjacent transistors have opposite polarities. Thus, current leakage occurring between the adjacent transistors under the isolation trench T1 is higher than the current leakage expected with a MOS structure, in which adjacent transistors have like polarities. The current leakage between the adjacent transistors causes a latch-up phenomenon to occur and a parasitic transistor to be formed between the adjacent transistors. Therefore, to reduce the current leakage, the surface area of the isolation trench should be increased. The increase in the surface area increases the distance between adjacent source/drain regions of the parasitic transistor, thereby increasing a threshold voltage of the parasitic transistor of the isolation region.

However, the increase in the surface area of the isolation trench results in a lower degree of integration of the semiconductor device due to an increase in its forming area.

SUMMARY OF THE INVENTION

The present invention has been made to solve the above problems.

In accordance with the invention, a trench structure is provided for isolating semiconductor elements in which both the formation of a parasitic transistor and the occurrence of the latch-up phenomenon can be suppressed, while the degree of integration of the semiconductor element is improved.

In accordance with the invention, a method is provided for forming a trench structure of a semiconductor device in which a CMP process can be easily performed by depositing a thin trench insulating layer to improve yield.

To achieve the above objects, the present invention provides a trench structure for isolating semiconductor elements of a semiconductor substrate. The trench structure includes a trench formed in the semiconductor substrate, the trench having at least two grooves provided at the bottom surface of the trench. An insulating material fills the trench including the grooves. Thus, the surface area of the trench structure is increased due to the grooves.

According to another aspect of the present invention, a method for forming a trench structure for isolating semiconductor elements is provided. A shallow groove pattern is formed on a semiconductor substrate. A portion of the semiconductor substrate where the trench is to be formed surrounding the shallow groove pattern is etched. Thus, the trench is formed having the shallow groove pattern on the bottom of the trench. The trench is filled with an insulating material including the shallow groove pattern.

According to an embodiment of the present invention, the shallow groove pattern is formed on the semiconductor substrate by forming a pad oxide layer on the semiconductor substrate, forming a nitride layer on the pad oxide layer, and depositing a photoresist on the nitride layer. A pattern on the photoresist is formed corresponding to the shallow groove pattern using a mask. A portion of the nitride layer is exposed through the patterned photoresist layer, the a portion corresponding to the shallow groove pattern. The nitride layer and the pad oxide layer are etched using the photoresist as a mask. The photoresist is removed and the semiconductor substrate is etched using the nitride layer as a mask, thereby forming the shallow groove pattern in the semiconductor substrate.

Etching a portion of the semiconductor substrate may be accomplished by removing all of the first photoresist, and next depositing a second photoresist on the nitride layer. A pattern on the second photoresist is formed corresponding to the trench on the second photoresist. The nitride layer and the pad oxide layer are etched using the second photoresist as a mask. The second photoresist is removed and the semiconductor substrate is etched using the nitride layer as a mask, thereby forming the trench having the shallow groove pattern.

Filling the trench with an insulating material may be accomplished by forming an insulating layer on the nitride layer which fills up the trench and the shallow groove pattern. A third photoresist is then deposited on the insulating material. A pattern on the third photoresist is formed such that the insulating material is exposed except for a portion corresponding to the trench. The insulating layer is etched using the third photoresist as a mask. The insulating layer is flattened to be flush with the nitride layer. Lastly, the nitride layer and the pad oxide layer are removed.

BRIEF DESCRIPTION OF THE DRAWINGS

The accompanying drawings, which are incorporated in and constitute a part of the specification, illustrate an embodiment of the invention, and, ether with the description, serve to explain the principles of the invention.

DETAILED DESCRIPTION

This application is substantially similar to Korean Patent Application No. 97-78396 filed on Dec. 30, 1997, the disclosure of which is incorporated herein by reference in its entirety.

An embodiment of the present invention will now be described in detail with reference to the accompanying drawings.

Figure 1A:
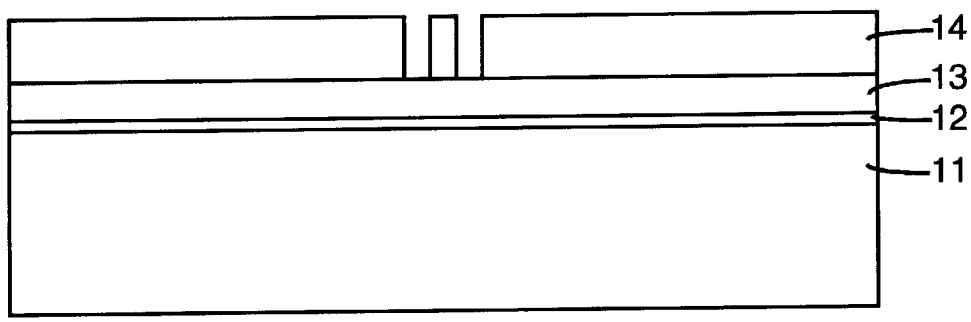
FIGS. 1A to 1G illustrate, in cross-section, a portion of a semiconductor device as it undergoes sequential processing steps for forming a trench structure in accordance with an embodiment of the present invention.
Figure 1B:
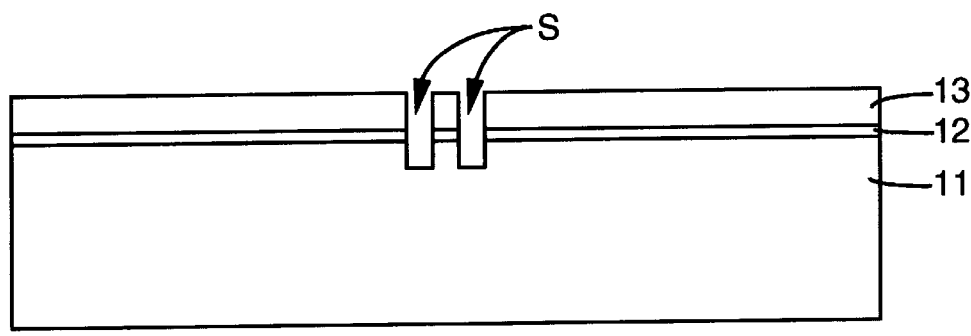
Figure 1C:
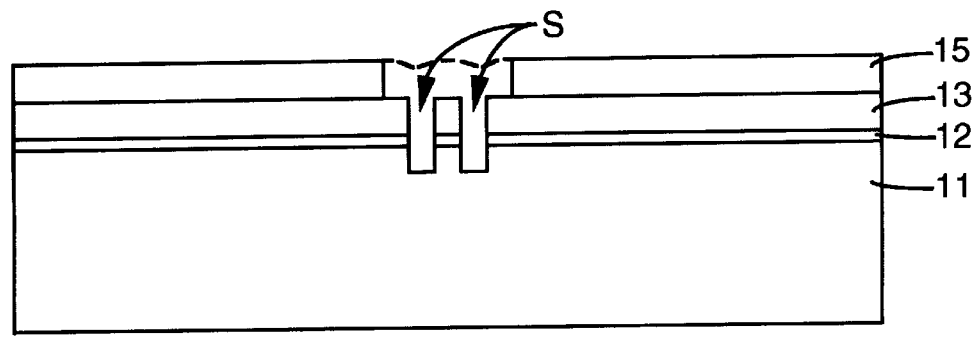
Figure 1D:
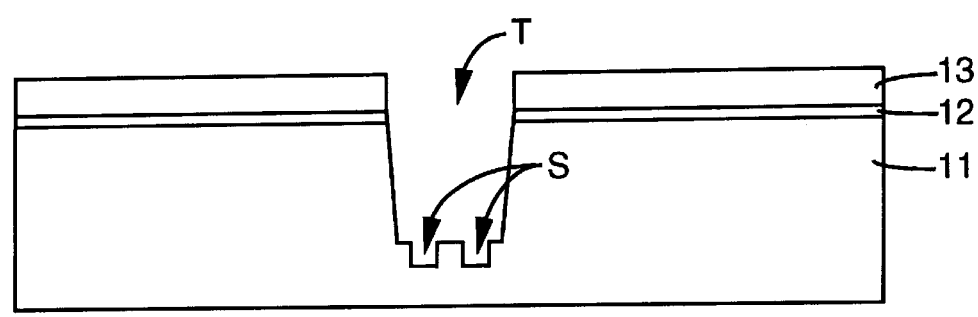
Figure 1E:
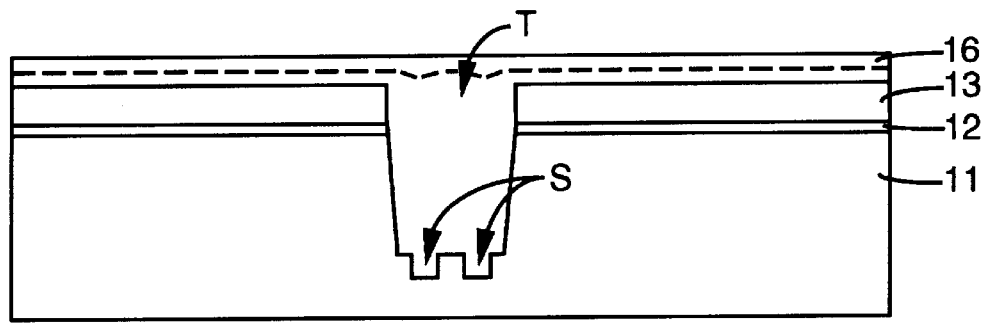
Figure 1F:
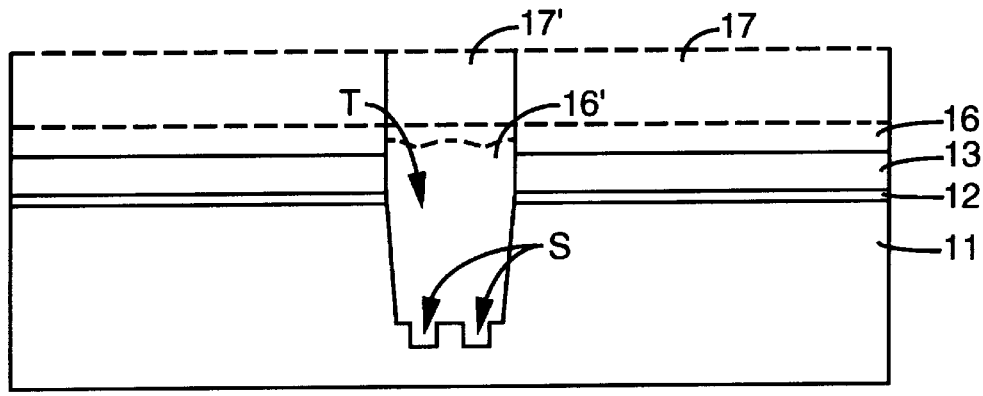
Figure 1G:
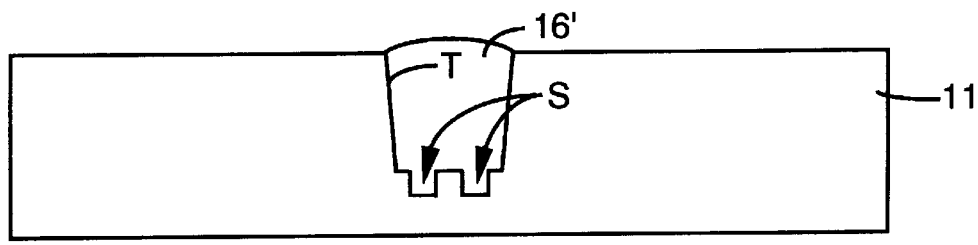
Figure 2:
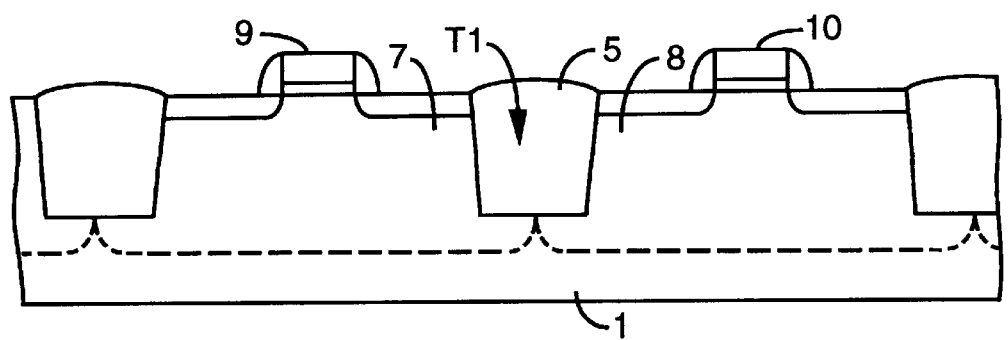
FIG. 2 is a schematic view of a conventional trench structure formed in a semiconductor substrate.

FIG. 1G shows a trench structure for isolating semiconductor elements in accordance with an embodiment of the present invention.

The inventive trench structure comprises a trench T formed in a semiconductor substrate 11 at a predetermined depth, at least two grooves S formed on the bottom of the trench T. and an insulating filling 16' filled in the trench T. The grooves S increase the surface area of the trench T. thereby suppressing the formation of a parasitic transistor and the occurrence of a latch-up phenomenon.

FIGS. 1A to 1G show sequential processing steps for forming the above-described inventive structure.

Referring first to FIG. 1A, a pad oxide layer 12, a nitride layer 13, and a first photoresist 14 are, in this order, formed on the semiconductor substrate 11. Using a mask, the first photoresist 14 is exposed to develop the same. Accordingly, a minute pattern of the first photoresist 14 is removed such that portions of the nitride layer 13 are exposed.

Referring to FIG. 1B, following this process, the as exposed portions of the nitride layer 13 are etched, a after which the newly-exposed portions of the pad oxide layer 12 are etched. Subsequently, the rest of the first photoresist 14 is removed, then the semiconductor substrate 11 is shallowly etched using the nitride layer 13 as a mask, thereby forming at least two grooves S.

Referring to FIG. 1C, following the above, a second photoresist 15 is deposited on the nitride layer 13, then exposed to develop the same using a mask such that a portion, corresponding to a predetermined trench pattern, of the nitride layer 13 is exposed.

Referring to FIG. 1D, the exposed portion of the nitride layer 13 is next removed, after which the newly exposed portion of the pad oxide layer 12 is removed through an etching process. The rest of the second photoresist 15 is then removed, and the trench T having a predetermined depth is formed in the semiconductor substrate 11 through an etching process using the nitride layer 13 as a mask such that the grooves S formed during the process described with reference to FIG. 1B are formed on the bottom of the same.

Referring to FIG. 1E, following the above, an insulating layer 16 is formed on the nitride layer 13 of the semiconductor substrate 11 through an evaporation process, filling the trench T with the same. At this point, the thickness of the insulating layer 16 may be less than that of the prior art as the trench T is provided with at least two grooves S.

Referring to FIG. 1F, a third photoresist 17 is next deposited on the insulating layer 16, then exposed to develop the same, thereby providing a photoresist pattern 17' on a portion of the insulating layer 16 corresponding to the trench T. After this process, the insulating layer 16 is etched using the photoresist pattern 17' as a mask, thereby providing a trench Ad insulating layer pattern 16'.

Referring to FIG. 1G. following the above, the photoresist pattern 17' is removed, then the trench insulating pattern 16' is made flush to the nitride layer 13 through a CMP (chemical mechanical polishing) process. The nitride layer 13 and the pad oxide layer 12 are then completely removed to result in a trench structure shown in FIG. 1G.

Subsequently, the semiconductor substrate 11 is cleaned, and a semiconductor device such as a transistor is formed on the semiconductor element areas of the semiconductor substrate 11 through a series of conventional processes, a detailed description of which will be omitted herein.

While this invention has been described in connection with one embodiment, it is to be understood that the invention is not limited to the disclosed embodiment, but, on the contrary, is intended to cover various modifications and equivalent arrangements included within the spirit and scope of the appended claims.

What is claimed is:

1. A method for forming a trench structure for isolating semiconductor elements, comprising:

forming a shallow groove pattern on a semiconductor substrate;

etching a portion of the semiconductor substrate where a trench is to be formed surrounding the shallow groove pattern, thereby forming the trench having the shallow groove pattern on a bottom of the trench; and filling the trench with an insulating material including the shallow groove pattern.

2. The method of claim 1 wherein forming a shallow groove pattern on a semiconductor substrate further comprises:

forming a pad oxide layer on the semiconductor substrate;

forming a nitride layer on the pad oxide layer;

depositing a photoresist on the nitride layer;

forming a pattern corresponding to the shallow groove pattern on the photoresist using a mask, such that a portion of the nitride layer is exposed, the portion corresponding to the shallow groove pattern;

etching the nitride layer and the pad oxide layer using the photoresist as a first mask;

removing the photoresist; and etching the semiconductor substrate using the nitride layer as a second mask.

3. The method of claim 1 wherein forming a shallow groove pattern on a semiconductor substrate further comprises:

forming a pad oxide layer on the semiconductor substrate;

forming a nitride layer on the pad oxide layer;

depositing a photoresist on the nitride a layer;

forming a pattern corresponding to the shallow groove pattern on the photoresist using a mask, such that a portion of the nitride layer is exposed, the portion corresponding to the shallow groove pattern; and etching the nitride layer, the pad oxide layer and the semiconductor substrate using the photoresist as a mask, thereby forming the shallow groove pattern in the semiconductor substrate.

4. The method of claim 3 wherein the photoresist is a first photoresist, the mask is a first mask, the pattern is a first pattern, and wherein etching a portion of the semiconductor substrate further comprises:

removing all of the first photoresist;

depositing a second photoresist on the nitride layer after removing all of the first photoresist;

forming a second pattern corresponding to the trench on the second photoresist;

etching the nitride layer and the pad oxide layer using the second photoresist as a second mask;

removing the second photoresist; and etching the semiconductor substrate using the nitride layer as a mask, thereby forming the trench having the shallow groove pattern.

5. The method of claim 3 wherein the photoresist is a first photoresist, the mask is a first mask, the pattern is a first pattern, and wherein etching a portion of the semiconductor substrate further comprises:

removing all of the first photoresist;

depositing a second photoresist on the nitride layer after removing all of the first photoresist;

forming a second pattern corresponding to the trench on the second photoresist; and etching the nitride layer, the pad oxide layer, and the semiconductor substrate using the second photoresist as a second mask, thereby forming the trench having the shallow groove pattern.

6. The method of claim 5 wherein filling the trench with an insulating material further comprises:

forming an insulating layer on the nitride layer, thereby filling up the trench and the shallow groove pattern with the insulating material;

depositing a third photoresist on the insulating layer;

forming a third pattern on the third photoresist such that the insulating layer is exposed except for a portion corresponding to the trench;

etching the insulating layer using the third photoresist as a third mask;

flattening the insulating layer to be flush with the nitride layer; and removing the nitride layer and the pad oxide layer.

* * * * *